(12) United States Patent
Nadeau-Dostie et al.

(10) Patent No.: US 6,442,722 B1
(45) Date of Patent: Aug. 27, 2002

(54) METHOD AND APPARATUS FOR TESTING CIRCUITS WITH MULTIPLE CLOCKS

(75) Inventors: Benoit Nadeau-Dostie, Aylmer (CA); David P. Buck, San Francisco, CA (US)

(73) Assignee: Logicvision, Inc., San Jose, CA (US)

( * ) Notice: Subject to any disclaimer, the term of this patent is extended or adjusted under 35 U.S.C. 154(b) by 0 days.

(21) Appl. No.: 09/430,686

(22) Filed: Oct. 29, 1999

(51) Int. Cl.[7] .............................................. G01R 31/28
(52) U.S. Cl. ...................................... 714/731; 714/729
(58) Field of Search ................................ 714/726, 729, 714/731

(56) References Cited

U.S. PATENT DOCUMENTS

| | | | |
|---|---|---|---|
| 5,008,618 A | * | 4/1991 | Van Der Star ............... 714/729 |
| 5,173,904 A | * | 12/1992 | Daniels et al. ............... 714/729 |
| 5,349,587 A | * | 9/1994 | Nadeau-Dostie et al. ... 714/729 |
| 5,428,622 A | * | 6/1995 | Kuban et al. ............... 324/73.1 |
| 5,504,756 A | * | 4/1996 | Kim et al. .................. 324/73.1 |

(List continued on next page.)

OTHER PUBLICATIONS

Crouch, A.L.; Mateja, M.; McLaurin, T.L.; Potter, J.C. and Tran, D.; The testability features of the 3rd generation ColdFire/sup (R)/ family of microprocessors; Motorola Inc., Austin, TX, USA; This paper appears in: Test Conference, 1999. Proceedings. Inte.*

(List continued on next page.)

Primary Examiner—Albert Decady
Assistant Examiner—Joseph D. Torres

(74) Attorney, Agent, or Firm—Sheridan Ross P.C.

(57) ABSTRACT

A method of testing a circuit having two or more clock domains at respective domain test clock rates and under control of a main test clock signal, the circuit having core logic, a plurality of scannable memory elements, each having a clock input, an input connected to an output of the core logic and/or an output connected to an input to the core logic, and configurable in scan mode in which the memory elements are connected to define one or more scan chains in each domain and in normal mode in which the memory elements are connected to the core logic in normal operational mode, the method comprising configuring the memory elements in scan mode; concurrently clocking a test stimulus into each scan chain of each clock domain including, for each clock domain having a domain test clock signal which is synchronous with respect to the main test clock signal, clocking the test stimulus at a shift clock rate derived from the main test clock signal and, for each clock domain having a domain test clock signal which is asynchronous with respect to the main test clock signal, clocking all but a predetermined number of bits of the test stimulus at a first domain shift clock rate derived from the main test clock signal followed by clocking the predetermined number of bits of the test stimulus at a second domain shift clock rate corresponding to the domain test clock rate; configuring the memory elements of each scan chain in normal mode in which the memory elements of each scan chain are interconnected by the core logic in the normal operational mode; clocking each memory element in each scan chain at its respective domain test clock rate for at least one clock cycle thereof; configuring the memory elements in scan mode; and clocking a test response pattern out of each of the scan chains at its respective domain shift clock rate during a respective scan-out interval, all respective scan-out intervals overlapping in time for a plurality of clock cycles at the highest of the respective clock rates.

34 Claims, 12 Drawing Sheets

U.S. PATENT DOCUMENTS

| | | | |
|---|---|---|---|
| 5,517,108 A | | 5/1996 | Kadowaki ................. 324/158.1 |
| 5,680,543 A | | 10/1997 | Bhawmik .............. 395/183.06 |
| 5,682,391 A | * | 10/1997 | Narayanan ................... 714/731 |
| 5,748,645 A | * | 5/1998 | Hunter et al. ................ 714/726 |
| 5,828,579 A | * | 10/1998 | Beausang .................... 714/726 |
| 5,841,670 A | | 11/1998 | Swoboda ..................... 364/578 |
| 5,909,451 A | | 6/1999 | Lach et al. .............. 371/22.31 |
| 5,949,692 A | * | 9/1999 | Beausang et al. .............. 703/15 |
| 6,079,039 A | * | 6/2000 | Nakamura ................... 714/724 |
| 6,173,428 B1 | * | 1/2001 | West ........................... 714/727 |
| 6,327,684 B1 | * | 12/2001 | Nadeau-Dostie et al. ... 714/731 |
| 6,327,685 B1 | * | 12/2001 | Koprowski et al. ......... 365/201 |

OTHER PUBLICATIONS

Van Rootselaar, G.J. and Vermeulen, B.; Silicon debug: scan chains alone are not enough; Philips Res. Lab., Eindhoven, Netherlands This paper appears in: Test Conference, 1999. Proceedings. International On pp.: 892–902, Sep. 28–30, 1999.*

Kee Sup Kim and Schultz, L.; Multi–frequency, multi–phase scan chain; Test Conference, 1994. Proceedings., International, 1994; pp.: 323–330.*

Nadeau–Dostie et al., "ScanBist: A Multifrequency Scan–Based BIST Method"; IEEE Design & Test of Computers, US, IEEE Computers Society, Los Alamitos, CA, 1994, 11(1):7–17.

* cited by examiner

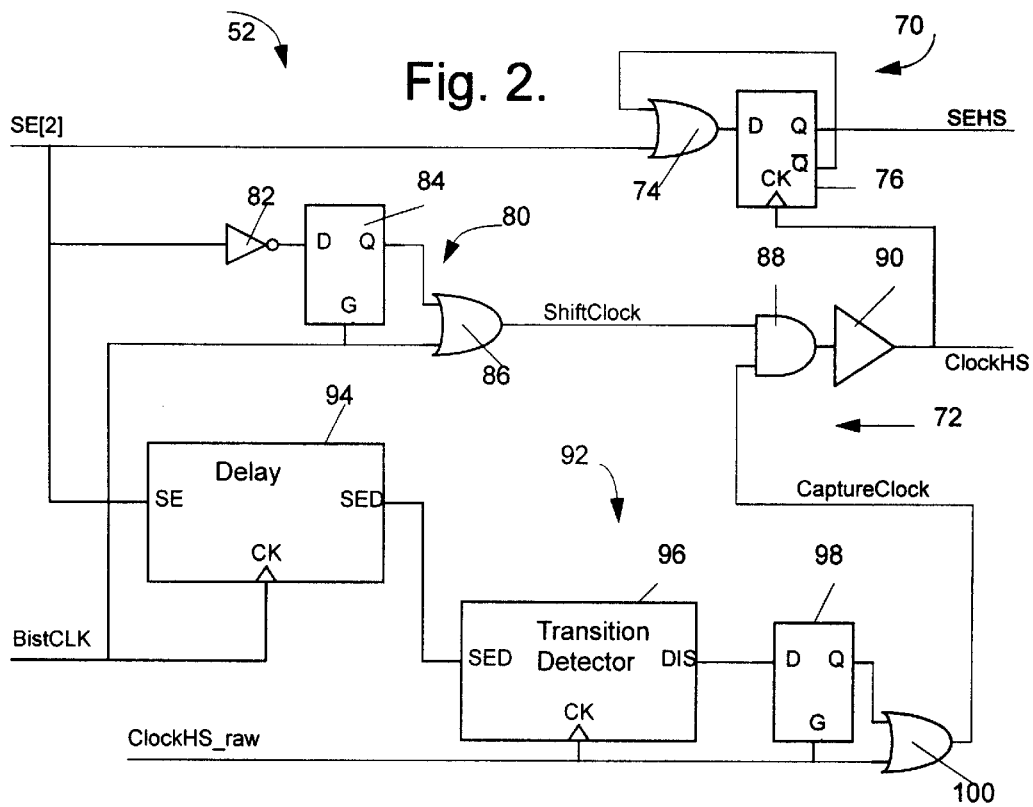
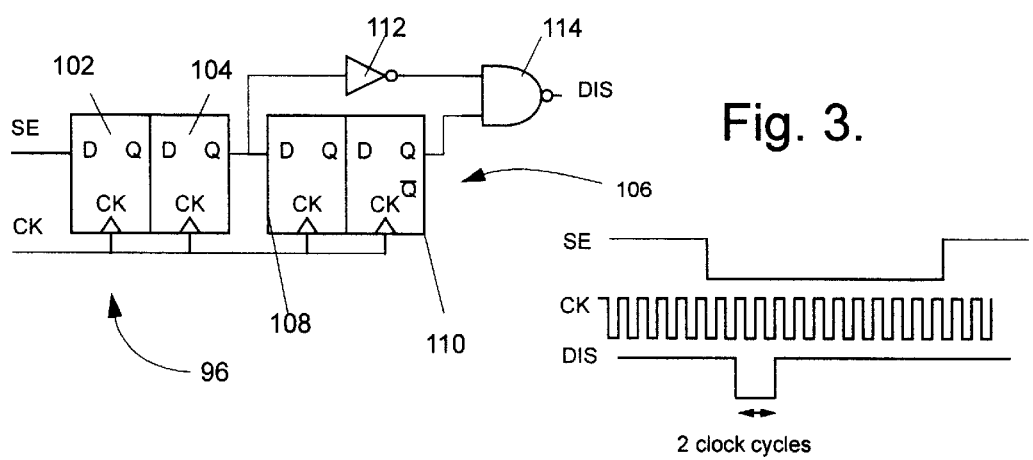

Fig.6.
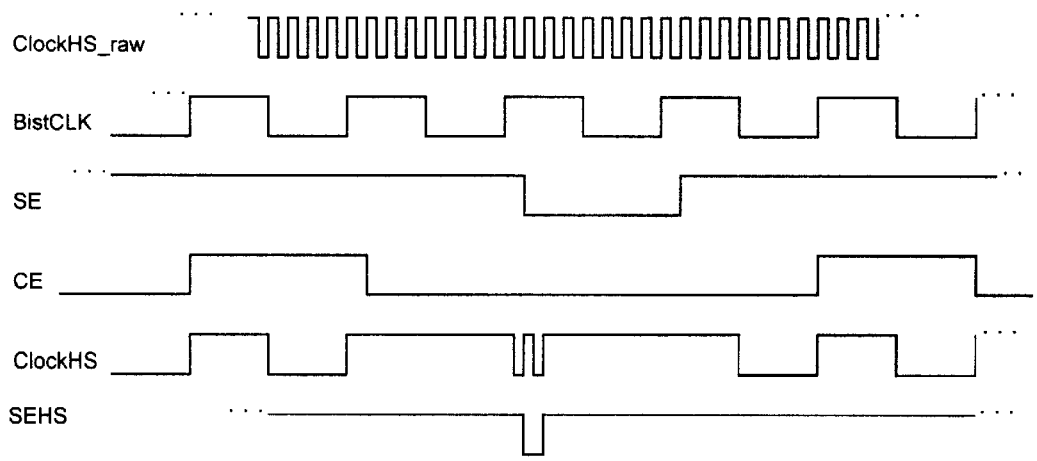
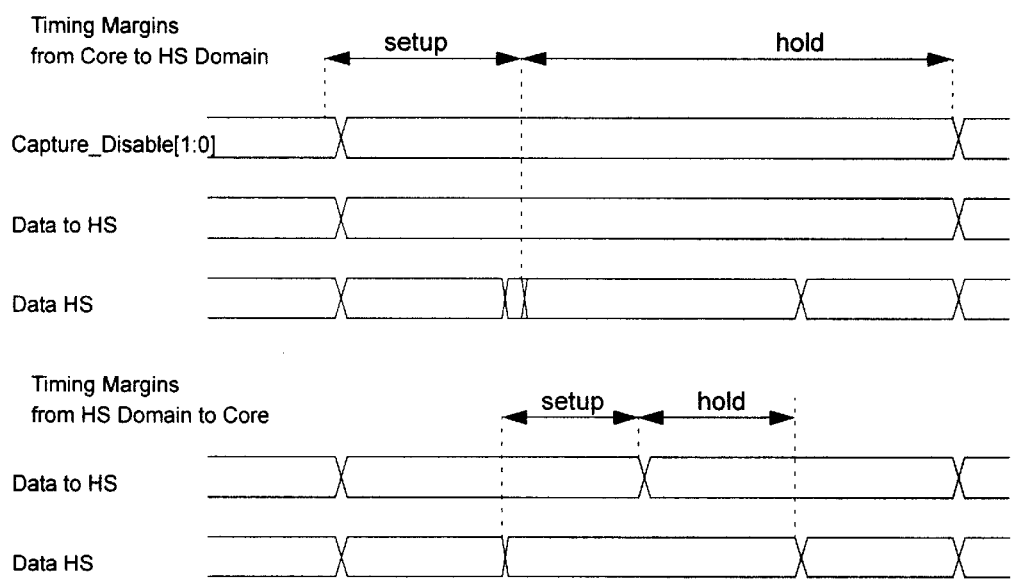

Fig. 9.
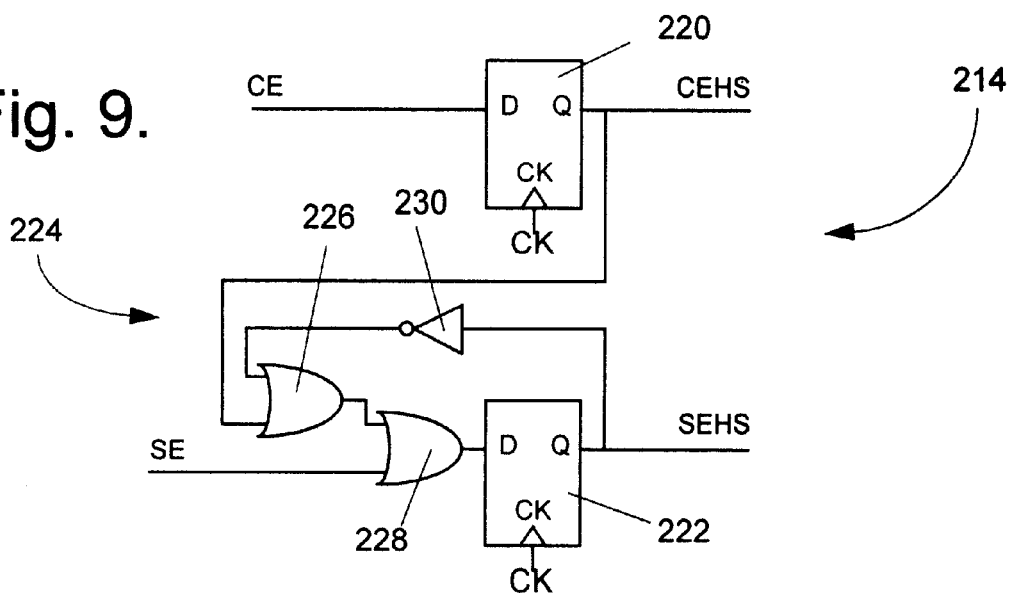
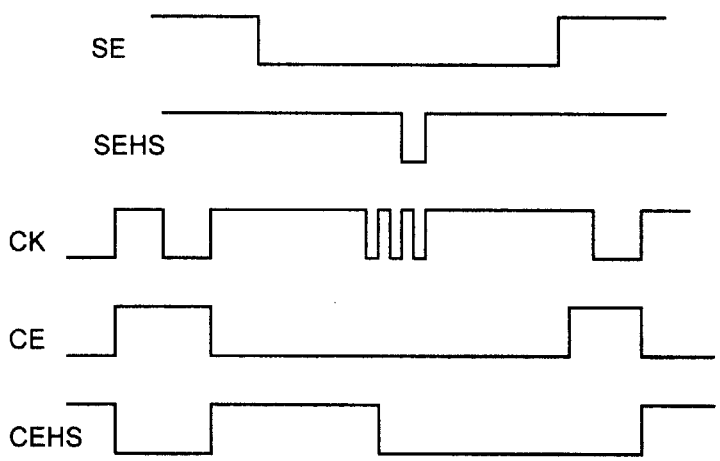

Fig. 10.
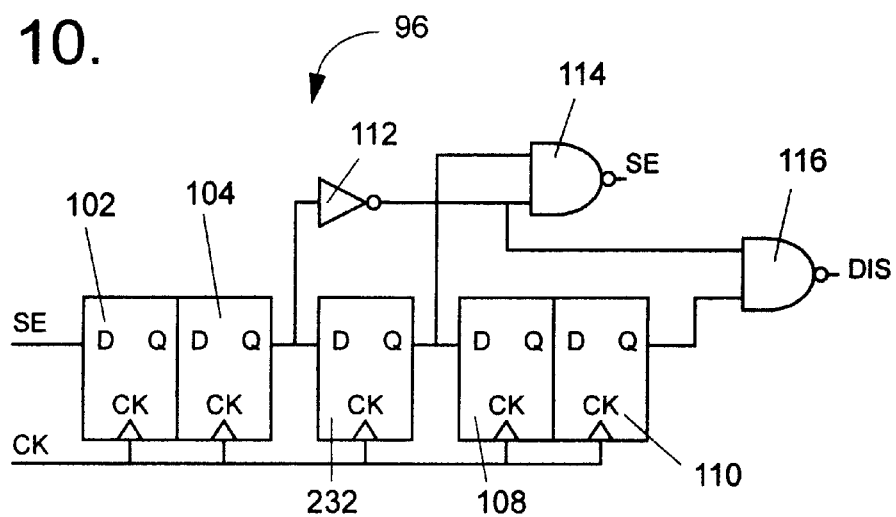
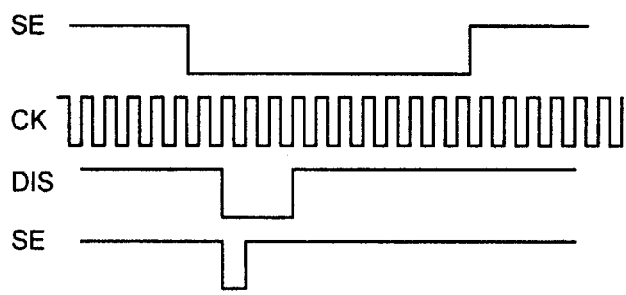

Fig. 11.
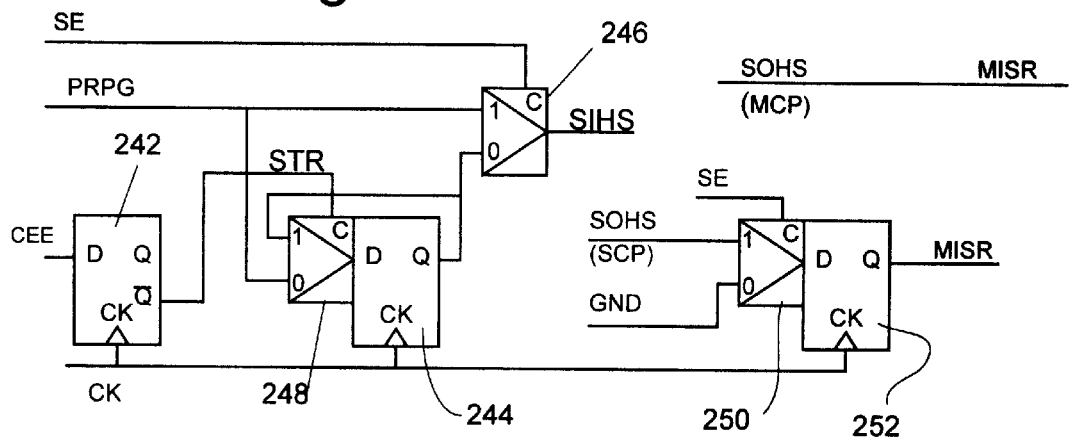
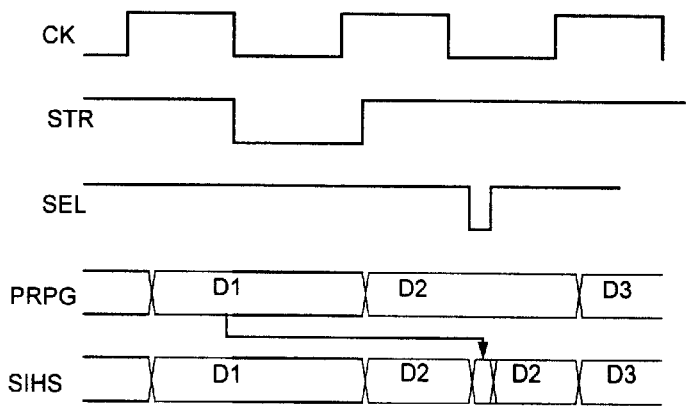

Fig. 13.
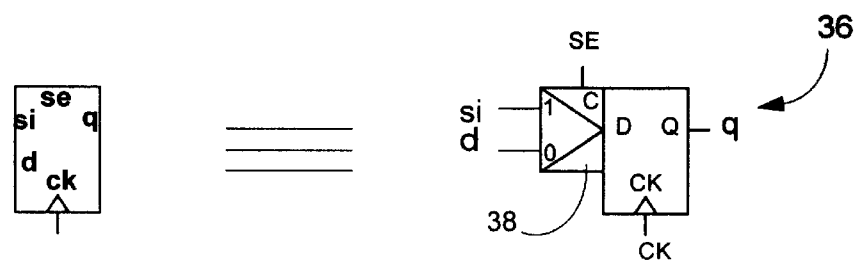
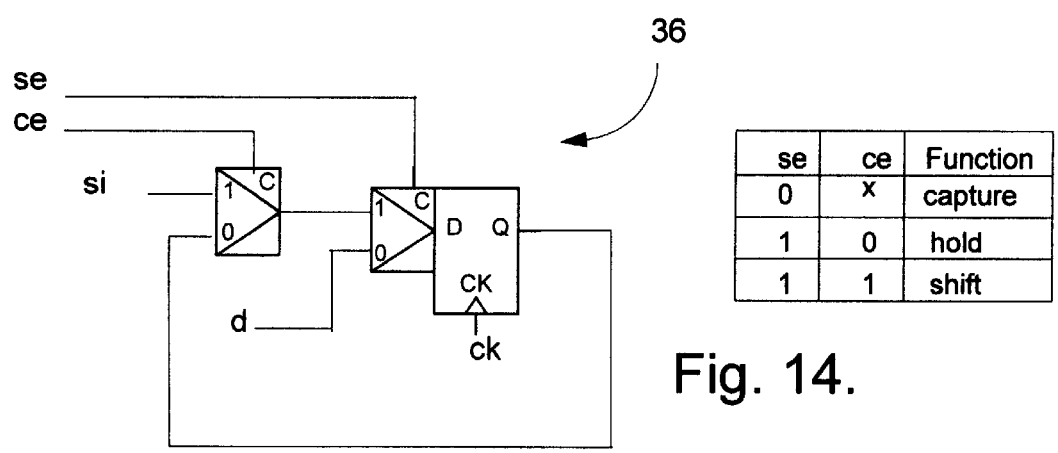
Fig. 14.

METHOD AND APPARATUS FOR TESTING CIRCUITS WITH MULTIPLE CLOCKS

The present invention relates to methods and apparatus for testing digital systems including integrated circuits and, more specifically, to built-in self testing of integrated circuits having multiple clock domains with asynchronous clocks and non-integer frequency ratios.

BACKGROUND OF THE INVENTION

Testing of digital systems, such as the core logic of an integrated circuit, is typically performed by loading a test pattern or stimulus into scannable memory elements in the system, launching the test data into the system, operating the system in normal mode for one clock cycle of the system clock, capturing the response of the system to the test stimulus, unloading the test response from the system and then comparing the response to the response which should have been obtained if the system was operating according to design. This test procedure is satisfactory for relatively simple systems which are comprised of only one clock domain or a plurality of clock domains whose clock are derived from the same clock source. It is well established that, in order to obtain accurate results, the test must be performed while operating the memory elements in the various clock domains at their respective normal operational clock rates during the capture operation. Difficulties arise when clock domains have clock sources which are different from the test clock signal used to perform the test, when domains have different clock rates, and/or when signals cross the boundary between clock domains having different clock frequencies. Since the elements in one domain operate at a different frequency from that of other domains in the system, special provisions must be made during testing to ensure that signals traversing clock domains are synchronized. Otherwise, the test response from the system will not be repeatable and test results will be unreliable. The problem is especially severe in built-in self-test systems.

Methods have been developed for testing systems in which the ratio of the frequencies of two clock domains is an integer. However, it is not uncommon for digital systems to employ asynchronous clocks whose frequencies are not multiples of each other. For example, one clock domain could employ a clock rate of 200 MHz and other domain could employ a clock rate of 78 MHz, resulting in a non-integer frequency ratio of 2.564 . . . Solutions have yet to be developed for clock domains having non-integer frequency ratios. Testing of such systems using the functional system clocks is difficult because the phase relationship between the system clocks is not known and is variable over time. The term "functional system clock" refers to the normal operating frequency of a digital system or portion thereof. In order to achieve very high reliability circuits, it is essential that all clock domains be tested at full-speed.

Heretofore, such circuits have been tested by using test clock rates that are essentially the same as the functional clock rates but disabling all signal paths crossing clock domain boundaries and repeating the test for each clock domain. The primary drawbacks of this approach are that part of the logic is not tested and a series of tests must be performed in order to test all parts of the system. However, even then, it is not possible to obtain results for all parts of the system operating concurrently at speed.

It is also known to use test clock rates that are as close as possible to those of the functional clocks without exceeding the functional clock rates and that are multiples of each other. This is done by using the fastest functional clock as the test clock for the domain with the fastest clock rate and generating the test clocks required by other clock domains from the main test clock signal using a simple clock divider. For example, in a system having one clock domain with a functional clock frequency of 200 MHz and another clock domain with a clock frequency of 78 MHz, test clock rates of 200 MHz and 50 MHz would be used for testing. Nadeau-Dostie et al U.S. Pat. No. 5,349,587 granted on Sep. 20, 1994 for "Multiple Clock Rate Test Apparatus for Testing Digital Systems" and Bhawmik U.S. Pat. No 5,680,543 granted on Oct. 21, 1997 for "Method and Apparatus for Built-In Self-Test With Multiple Clock Circuits", both incorporated herein by reference, illustrate the latter approach. Clearly, the primary drawback of this approach is that one of the clock domains is not tested at its full-speed (78 MHz).

It is also possible to combine the above methods sequentially. The drawbacks of this approach are longer test times, more complex test circuitry than is desirable and the inability of simultaneously or concurrently testing all components at their functional clock rates.

Thus, there is a need for testing method and circuitry which enables the testing at the design or functional speed of digital systems having two or more clock domains with asynchronous clocks whose frequencies are not multiples of one another.

SUMMARY OF THE INVENTION

The present invention seeks to provide a method and a test control circuit for use in testing digital systems having core logic and scanable memory elements arranged in two or more clock domains with independent clock sources and, more specifically, for testing the entire circuit in a single session even if the clock frequencies are asynchronous.

Generally, the method of the present invention involves concurrently clocking a test stimulus into each scan chain of each clock domain using a clock frequency corresponding to or derived from a main test clock signal. In synchronous clock domains, in which the domain clock signal is synchronous with respect to the main test clock rate, the entire test stimulus is clocked in at the same respective clock rate. In asynchronous clock domains, in which the domain clock signal is asynchronous with respect to the main test clock rate, a portion of the test stimulus is clocked in using a first shift clock signal derived from the main test clock signal and the balance of the test stimulus is clocked in using a second shift clock signal which is derived from the respective domain test clock signal. Each domain is operated for one cycle of its respective domain test clock rate during the capture operation. Response data is clocked out of each domain using the clock signal used to clock in the test stimulus. In asynchronous clock domains, the first shift clock signal is used to clock out the response data.

The number of bits of the test stimulus clocked in at the respective first and second shift clock rates depends on whether the memory elements in the scan chain source a single cycle path or a multi-cycle path. In single cycle path scan chains, only the last bit is clocked in at the second shift clock rate. In multi-cycle signal path scan chains, the last few bits of the test stimulus are clock in at the second shift clock rate wherein the number of bits correspond to the number of cycles of the multi-cycle signal path. One aspect of the method resides in the timing of and the manner in which the transition from the first to the second shift clock is effected.

The test control circuitry is comprised of a main test controller which is clocked by a main test clock and an auxiliary test controller for each asynchronous clock domain. The auxiliary test controller is clocked by the main test clock and a domain test clock. The portion of the auxiliary test controller clocked by the domain test clock is very small and can operate at very high speed. This is particularly useful when the frequency of the domain test clock does not allow operation of a full test controller or when the clock domain itself contains a small amount of logic. The auxiliary test controller is provided with the capability of selecting between a first shift clock corresponding to or derived from the main test clock and a second shift clock corresponding to the domain test clock and operates to generate a memory element clock signal and re-timed configuration signals. The clock domains may be non-interacting, interacting, and/or the source of multi-cycle signal paths.

Thus, one aspect of the present invention is generally defined as a method of testing a circuit having two or more clock domains at respective domain test clock rates and under control of a main test clock signal, said circuit having core logic, a plurality of scannable memory elements, each having a clock input, an input connected to an output of said core logic and/or an output connected to an input to said core logic, and configurable in scan mode in which said memory elements are connected to define one or more scan chains in each said domain and in normal mode in which said memory elements are connected to said core logic in normal operational mode, said method comprising:

configuring said memory elements in scan mode;

concurrently clocking a test stimulus into each scan chain of each said clock domain including, for each clock domain having a domain test clock signal which is synchronous with respect to said main test clock signal, clocking said test stimulus at a shift clock rate derived from said main test clock signal and, for each clock domain having a domain test clock signal which is asynchronous with respect to said main test clock signal, clocking all but a predetermined number of bits of said test stimulus at a first domain shift clock rate derived from said main test clock signal followed by clocking said predetermined number of bits of said test stimulus at a second domain shift clock rate corresponding to said domain test clock rate;

configuring said memory elements of each scan chain in normal mode in which the memory elements of each scan chain are interconnected by said core logic in the normal operational mode;

clocking each memory element in each scan chain at its respective domain test clock rate for at least one clock cycle thereof;

configuring said memory elements in scan mode; and clocking a test response pattern out of each of the scan chains at its respective domain shift clock rate during a respective scan-out interval, all respective scan-out intervals overlapping in time for a plurality of clock cycles at the highest of the respective clock rates.

Another aspect of the present invention is generally defined as a test controller for use in testing an integrated circuit having core logic circuitry and two or more clock domains operable at respective domain clock rates, each clock domain having a plurality of scannable memory elements, each having a clock input, an input connected to an output of said core logic and/or an output connected to an input to said core logic, and configurable in scan mode in which said memory elements are connected to define one or more scan chains in each said domain and in normal mode in which said memory elements are connected to said core logic in normal operational mode, said test controller comprising:

a primary test controller for controlling circuit test operations under control of a main test clock signal, said primary test controller being operable to:

concurrently load a test stimulus to each scan chain in each clock domain and receive response data from each said scan chain at respective domain shift clock rates;

generate respective domain shift clock signals derived from said main test clock signal for each clock domain; and generate respective domain configuration control signal for each asynchronous clock domain in which the domain test clock signal is asynchronous with respect to said main test clock signal; and an auxiliary test controller associated with each said asynchronous clock domain for controlling test operations therein under control of said primary test controller, each said auxiliary test controller being operable to generate a memory element clock signal derived from said respective domain shift clock signal when said respective domain configuration control signal is active and derived from said domain test clock signal when said domain configuration control signal is inactive;

each said auxiliary test controller being responsive to said respective configuration control signal by generating memory element configuration signals operable for configuring said memory elements in said scan mode or said normal mode.

BRIEF DESCRIPTION OF THE DRAWINGS

These and other features of the invention will become more apparent from the following description in which reference is made to the appended drawings in which:

FIG. 2 diagrammatically illustrates a more detailed view of the auxiliary test controller of FIG. 1;

FIG. 3 diagrammatically illustrates a transition detector and a signal timing diagram which may be used in the auxiliary test controller of FIG. 2;

FIG. 6 is a timing diagram similar to FIG. 4 showing the state of key signals in the embodiment of FIG. 5;

FIG. 9 diagrammatically illustrates a transition detector and a signal timing diagram which may be used in the auxiliary test controller of FIG. 8;

FIG. 10 diagrammatically illustrates a circuit and a signal timing diagram for generating of domain scan enable and clock enable signals required to support multi-cycle paths;

FIG. 11 diagrammatically illustrates a circuit and a signal timing diagram for retiming a scan test path data for a circuit having multi-cycle paths.

FIG. 13 illustrates a scannable memory device, which includes a flip flop and a multiplexer, and a diagrammatic representation of the device; and FIG. 14 illustrates one of several possible configurations of the scannable memory element of FIG. 13.

DETAILED DESCRIPTION OF PREFERRED EMBODIMENTS OF THE INVENTION

Figure 1:
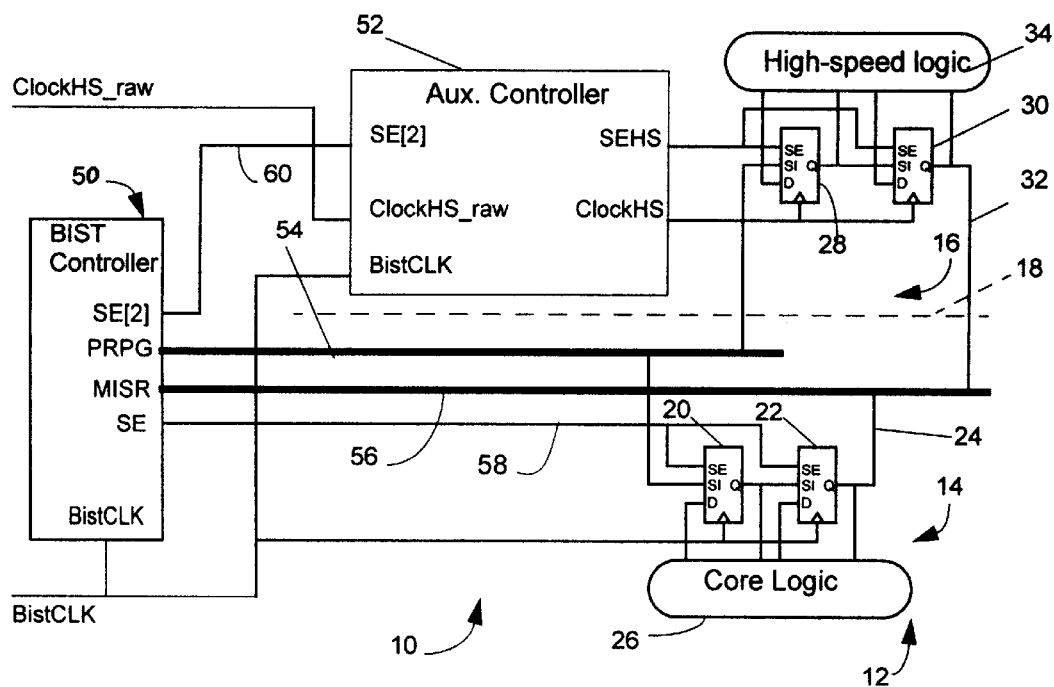
FIG. 1 diagrammatically illustrates a circuit having non-interacting low speed and high speed clock domains, a primary test controller and an auxiliary test controller in accordance with one embodiment of the present invention.

A typical integrated circuit with which the present invention is concerned includes core logic and a plurality of scannable memory elements in two or more clock domains with the memory elements in each domain being arranged in one or more scan chains for shifting test vectors into the memory elements and shifting response data out of the chains for analysis.

One or more domains may be clocked by a main test clock signal or by a signal derived therefrom, i.e. a signal having one-half or one-quarter of the clock rate of the main test clock. Since these clock signals originate from the same source, they are considered to be synchronous signals and the domains which use these signal are considered to be synchronous clock domains.

A number of the domains, may be provided with independent test clock signals, i.e., signals which are not derived from the main test clock signal. These signals may have the same or a different clock rate compared with that of the main test clock. Signals which are not multiples of the main test clock rate typically present particular difficulty during testing. Since these signals originate from a different source, they are considered to be asynchronous. Similarly, the domains which use these signals are considered to be asynchronous clock domains.

Some scan chains are comprised of memory elements which are the source of single cycle paths, i.e. a path which requires only one cycle for a signal to propagate from its source to its destination. These paths do not present particular difficult unless located in a domain which includes a multi-cycle signal path scan chain. A multi-cycle signal path is a path which requires more than one cycle of the clock signal for a signal to propagate from its source to its destination. In addition to this difficulty, the clock frequency of asynchronous domains may be higher than the frequency of the main test clock signal and may be integer or non-integer multiples of the main test clock signal.

Interacting clock domains, i.e. domains which exchange one or more signals, also present special problems during testing because the timing of the capture cycle must be performed during an overlapping normal mode interval in which the memory elements of each scan chain are interconnected by the core logic in a normal operational mode and in which all respective normal mode intervals overlap in time for at least one clock cycle at the highest clock rate of the domain test clock rates.

The description and drawings address three sample circuits to illustrate the manner in which the present invention addresses the difficulties outlined above. FIGS. 1–4 illustrate a circuit in which the memory elements are partitioned into low speed and high speed non-interacting clock domains. FIGS. 5 and 6 illustrate a similar circuit, but the low speed and high speed domains communicate with one another along signal paths which traverse a clock domain boundary. FIGS. 7–12 illustrates a circuit which includes a scan chain comprised of memory elements which source multi-cycle path signals and a scan chain with single cycle path memory elements. Each of these applications is described in more detail below.

By way of overview, the manner in which the present invention handles this wide variety of circuit architecture is to consider the three basic steps of the standard test method (scan-in, capture and scan-out) independently.

During the scan-in operation, a test stimulus is concurrently clocked into each scan chain of each clock domain at respective domain shift clock rates derived from a main test clock signal. In synchronous clock domains, the same clock rate is used throughout the entire test, although the clock rate may differ from one synchronous domain to another. In asynchronous clock domains, a portion of the test stimulus is clocked in at a first shift clock rate derived from the main test clock signal and the balance of the test stimulus is clocked in a second clock rate derived from the respective domain test clock rate. Typically, the clock signal is suppressed for a period of time in the transition from the first and second shift clock signal so that the balance of the test stimulus is shifted in immediately before and in synchronism with the capture cycle. The method of the present invention addresses the timing of the application of mode configuration signals to the memory elements.

During the capture operation in which the memory elements are connected to the core logic in normal mode, all memory elements in all domains are clocked at their respective domain test clock rates. The memory element clock signal may be suppressed immediately following capture in high speed and/or asynchronous domains so that response data can be clocked out from the scan chains during overlapping time periods in each domain.

During the scan out operation, the memory elements in each domain are clocked at their respective domain shift clock rate, with the first domain shift clock rate being used in asynchronous clock domains.

The control circuitry includes a primary controller and an auxiliary test controller for each asynchronous clock domain. In addition to the functions performed by conventional test controllers, the primary controller provides configuration control signals and respective shift clock signals derived from the main test clock to each asynchronous clock domain. The auxiliary controllers generate local memory element mode control signals and clock signal and apply these to the memory elements in response to the state of the configuration control signal.

While the description which follows refers to low speed clock domains and high speed clock domains, the domains are to be considered to be synchronous and asynchronous clock domains. Clock domains need not necessarily operate at different speeds to warrant use of the invention.

FIGS. 1–4—Non-Interacting Clock Domains

FIG. 1 diagrammatically illustrates a portion of an integrated circuit 10 having core logic 12 partitioned into two clock domains including a low speed domain 14 and a high speed domain 16. Dashed line 18 signifies the boundary between the two clock domains. In this simple circuit, no signal paths traverse the boundary between the two clock domains and therefore the two domains are non-interacting. Each clock domain is comprised of two scannable memory elements arranged in a scan chain and connected to combinational logic. Low speed domain 14 consists of two scannable memory elements 20 and 22 arranged in a scan chain 24 and combinational logic 26 to which the memory elements are connected. High speed domain 16 consists of two scannable memory elements 28 and 30, arranged in a scan chain 32, and combinational logic 34 to which the memory elements are connected.

The scannable memory elements in the embodiments of FIGS. 1–6 are of identical construction and include, as best shown in FIGS. 13 and 14, a memory device 36 and a multiplexer 38. Memory device 36 may be a D-Type flip-flop having a data input D, a clock input CK and an output Q. Input D is connected to the output of the multiplexer. Output Q is connected to the combinational logic and to the "si" input of the next scannable memory element in the scan chain. Multiplexer 38 is provided with inputs "si" and "d" and a select input "se". The "d" input is connected to an output from the combinational logic. The "se" input receives a scan enable signal SE. when the scan enable signal is active, the multiplexer connects the "si" input to the D input of the memory device. This configuration is referred to herein as "scan mode". When SE is inactive, the multiplexer connects the "d" input to the D input of the memory device. This configuration is referred to as "normal mode" or "capture mode".

It will be understood that typical circuits may have many scan chains and many more memory elements in each scan chain. The problem which must be overcome is how to test, in a single pass, a circuit in which different portions of the circuit operate at different speeds.

The present invention provides a primary test controller 50, also referred to as a Built-In Self-Test (BIST) controller, and an auxiliary test controller 52 for each additional or high speed clock domain. The primary controller is connected to and controls test operations in synchronous clock domains, which, in FIG. 1, is low speed clock domain 14. While the two controllers are shown separately, the auxiliary controller could be incorporated into the circuitry of the primary controller.

BIST controllers are well known in the art and include several sub-circuits which provide a variety of functions. Such sub-circuits are not be described herein. It will be understood that such circuit would be included in the BIST controller of the present invention. The main test controller includes a Pseudo Random Pattern Generator whose output, PRPG, is connected to an output bus 54 connected to the input of each scan chain in the circuit. The primary test controller also includes a Multiple Input Signature Analyzer having an input MISR connected to input bus 56 connected to the output of each of the scan chains. Pseudo Random Pattern Generators and Multiple Input Signature Analyzers are well known in the art and accordingly are not be described further herein.

The role of the primary controller is to control test operations, including generating and applying test vectors or stimuli to the scan chains in the circuit, generating memory element configuration signals for configuring memory elements in scan or normal mode, and analysing responses of the combinational logic to the applied scan test vectors and other specific functions which need not be described herein.

The primary controller receives a main test clock signal, BistClk. The primary controller delivers scan test vectors to the various scan chains along output bus 54 and receives responses from the scan chains along input bus 56. The primary controller may serve as the auxiliary controller of the low speed domain and provides a Scan Enable signal, SE, along an output line 58 to the SE input to each memory element in the low speed domain 14. The primary controller also generates a configuration control signal for each of the other clock domains in the circuit. In the circuit of FIG. 1, the controller provides a configuration control signal, SE[2], along an output line 60 to auxiliary controller 52 for use in configuring the memory elements in its associated high speed domain. In FIG. 1, there is only one additional or high speed domain.

The auxiliary controller controls the configuration of the memory elements in its associated clock domain and applies an appropriate clock signal to the memory elements in response to the configuration control signal provided by the main test controller. As explained more fully below, the auxiliary test controller uses the main test clock for shifting all but a predetermined number of bits of the test stimulus into the high speed scan chain 32 and for shifting captured data out of the scan chain. In the illustrated example all but the last bit of the test stimulus are shift in under control of the main test clock. The auxiliary test controller uses a predetermined domain clock signal to perform a capture sequence which includes launching the last bit and performing a capture operation.

The auxiliary test controller has three inputs. It receives the main test clock signal, BistClk, and configuration control signal, SE[2], from the primary controller, and a source domain test clock signal, ClockHS_raw. Thus, the domain test clock signal is asynchronous with respect to the main test clock signal, BiskClk. The auxiliary controller generates and applies a local memory element configuration signal, SEHS, to the SE input of each of the memory elements and a domain clock signal, ClockHS, to the clock input of the memory elements in its associated domain. The frequencies of the main and domain test clock signals, are chosen to correspond substantially to the frequencies used during the normal operation of the circuit so that delay defects in the circuit affecting the normal operation of the circuit can be detected during the test. The SEHS signal corresponds to the Scan Enable signal mentioned earlier and to the Scan Enable signal applied to the memory elements in the low speed domain.

An active configuration control signal SE[2] indicates that the scan chains in asynchronous clock domain 16 should be configured in scan or shift mode and clocked by a first shift clock signal derived from the main test clock signal. The signal is made active at the beginning of a first test stimulus loading sequence in which a portion of the test stimulus is clocked into the scan chains. The transition of the configuration control signal from an active to an inactive value indicates the start of a second loading sequence which is effected using the domain test clock signal and in which the balance of the test stimulus is loaded into the scan chains. The second loading sequence consists of configuring the scannable memory elements of the clock domain in a scan mode for a full cycle of operation and applying one active edge of the domain clock signal to the clock input and then configuring the scannable memory elements in a capture or normal mode and applying one active edge of the domain clock to the clock input of the memory elements. In the embodiment of FIG. 1, only one active edge of the domain test clock is applied during the second shift sequence because only one active edge is required to effect a full cycle of operation of the memory elements. As explained later, memory elements which source multi-cycle scan paths require more than one active edge to effect a full cycle of operation. This final shift cycle serves to launch the test data at the high speed clock rate.

FIG. 2 is a more detailed block diagrammatic view of the auxiliary test controller 52. The auxiliary test controller is comprised of two sub-circuits, a control signal generating circuit 70 and a local clock signal generating circuit 72.

Control signal generating circuit 70 generates a local scan enable signal, SEHS, for the clock domain 16. Circuit 70 is comprised of an OR gate 74 and a memory element 76 which stores the current state of the high speed scan enable signal and is driven by the local high speed clock signal, ClockHS. The high speed scan enable signal, SEHS, is generated by combining, in the OR gate, the scan mode control signal SE[2] received from the main test controller and the current state of the memory element. An active configuration control signal causes the scan enable signal to become active after the memory element receives an active edge at its clock input. When the configuration control signal is inactive, the scan enable signal is inverted on the next active edge at its clock input.

Local clock signal generating circuit 72 generates the domain clock signal, ClockHS, for the high speed clock domain 16. The clock signal applied to the clock input of the memory elements of clock domain 16 is a composite of the main test clock and domain test clock signals. During the first shift sequence, a shift clock is generated by enabling clock pulses of the main test clock signal. During the second shift sequence, a second shift clock signal is generated by enabling clock pulses of the domain test clock signal. Control signal SE[2] determines which clock is active at any given time.

Local clock signal generating circuit 72 includes a first circuit 80 comprised of an inverter 82, a transparent latch 84, clocked by BistClk, an OR gate 86, an AND gate 88, and a buffer 90. The inverter receives configuration control signal, SE[2], inverts it and applies the inverted signal to one input of the OR gate 86 which also receives the main test clock signal, BistClk, at its other input. The output of the OR gate is a shift clock signal which is applied to one input of AND gate 88. It will be seen that when the control signal is active, the output of the latch is inactive and therefore the shift signal is the main test clock signal. When the configuration control signal becomes inactive, the output of latch 84 becomes active and is immediately reflected in the shift signal. The inputs to the AND gate are the shift clock signal and a capture clock signal derived from the second circuit described below. The capture clock signal, which corresponds to the second shift clock signal mentioned above, is active while the configuration control signal is active. Thus, the first shift clock signal is passed though the AND gate while the control signal is active.

The output of AND gate 88 is applied to buffer 90, whose output is the local high speed clock signal, ClockHS. The buffer drives all clock inputs of the memory elements in the second clock domain. The buffer minimizes potential timing problems related to clock skew. In the event that the auxiliary test controller does not contain the clock buffer, an additional input (not shown) is required to connect the output of the clock buffer back into the auxiliary test controller.

Local clock signal generating circuit 72 includes a second circuit 92 is comprised of a delay circuit 94 clocked by the main test clock signal, a transition detector 96 and a retiming latch 98, both clocked by the domain test clock signal, and an OR gate 100.

Delay circuit 94 is comprised of memory elements (not shown) clocked by the main test clock signal for delaying the configuration control signal. By providing memory elements that can update in response to the rising and falling edges of the clock signal, it is possible to delay the control signal by ½, 1, 1½ etc . . . clock cycles. The delay is chosen such that the capture clock signal, derived from the domain test clock signal, becomes active approximately in the middle of the period of time period in which the configuration control signal is inactive. The configuration control signal becomes inactive after the penultimate shift cycle and prior to the last shift cycle in order to shift in the last vector at the domain test clock rate.

Primary controller 50 deactivates the configuration control signal SE[2] consequent to the penultimate shift cycle of the main test clock. However, the transition must be delayed until after the last shift cycle has occurred in the synchronous, low speed domain 14. This will ensure that the launch of the test vector and the capture in asynchronous high speed domains occurs concurrently with or consequent to the launch and capture in the low speed domain during an overlapping normal mode interval in which the memory elements of each scan chain of the interacting synchronous and asynchronous domains are interconnected by the core logic in the normal operational mode with all respective normal mode intervals overlapping in time for at least one clock cycle at the highest of the respective domain test clock rates. In the specific circuit shown in FIG. 1 in which there are only two non-interacting domains, capture need not be performed during overlapping normal mode intervals. The delay must take into account the delay introduced by the transition detector 96, described below.

FIG. 3 illustrates a transition detector 96 which may be employed to detect the falling edge of the control signal. Since the main test clock signal and the domain test clock signal can be asynchronous to one another, the scan mode control signal generated using the main test clock must be synchronized with the domain test clock. This is done by sampling the delayed control signal, SED, using two memory elements 102 and 104 connected in series. Usually, two memory elements are sufficient to guarantee that the delayed control signal is well synchronized and that the circuit will not enter a metastable state. This method of synchronizing is well known in the art. The output of this first part of the circuit is a synchronized delayed control signal.

A second part 106 of the transition detector generates a capture clock disable signal, DIS, which corresponds to a detected transition. This part of the circuit includes two memory elements 108 and 110 which receive the synchronized delayed configuration control signal and define the duration of the capture sequence. The output of the first part of the circuit is applied to inverter 112 whose output is applied to one input of NAND gate 114. The output of second memory element 110 is applied to the other input of the NAND gate. All memory elements in the transition detector are clocked by the domain test clock signal.

The timing diagram in FIG. 3 shows the delayed control signal, SED, the domain clock signal, ClockHS, and signal DIS. The falling edge of DIS results from clocking SED through elements 102 and 104. The duration of DIS results from clocking the synchronized SED signal through elements 108 and 110. DIS is active during shift operations and inactive during the capture sequence. Some circuits may require a DIS duration of more than three clock cycles (such as the embodiment of FIGS. 7–12). An active value of this signal disables the capture clock signal and an inactive value enables it. The inactive value is generated in response to a transition from an active to an inactive value of the synchronized delayed control signal. The inactive value is generated for a predetermined number of the second clock cycles. In the example shown, this number is two, the first cycle launches the test vector from the memory elements and the second cycle captures the response to the test vector.

Figure 4:
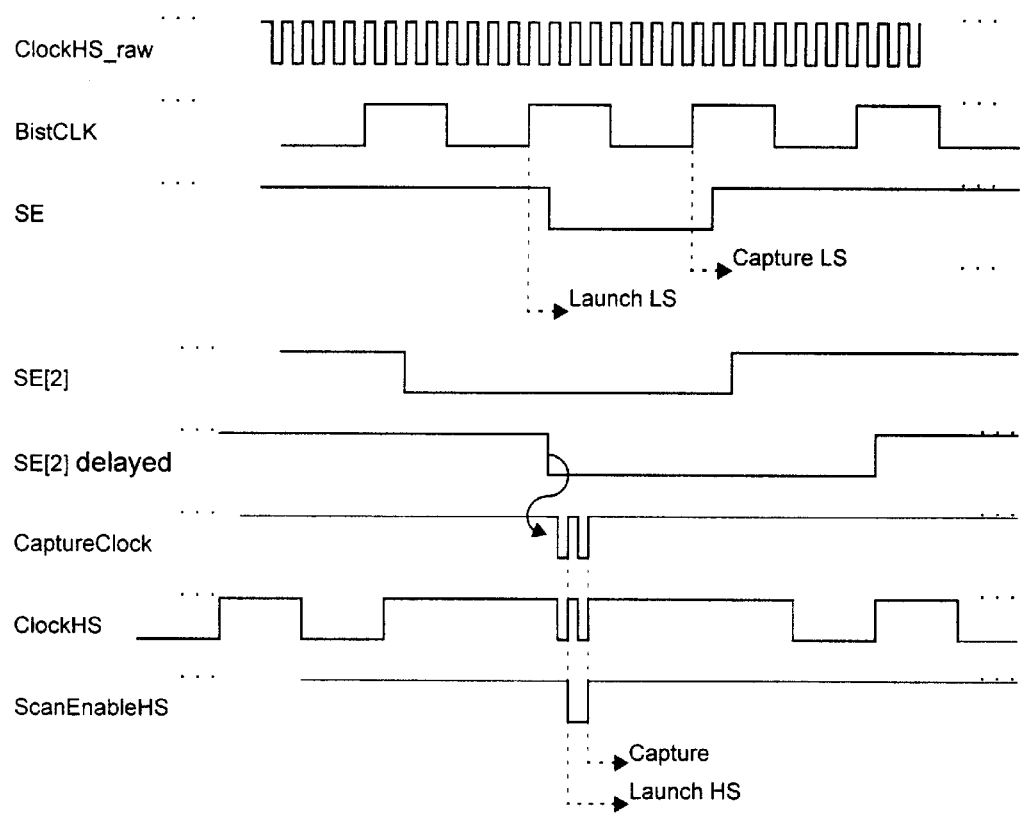
FIG. 4 is a timing diagram illustrating the state of a number of key signals during the course of a test.
Figure 5:
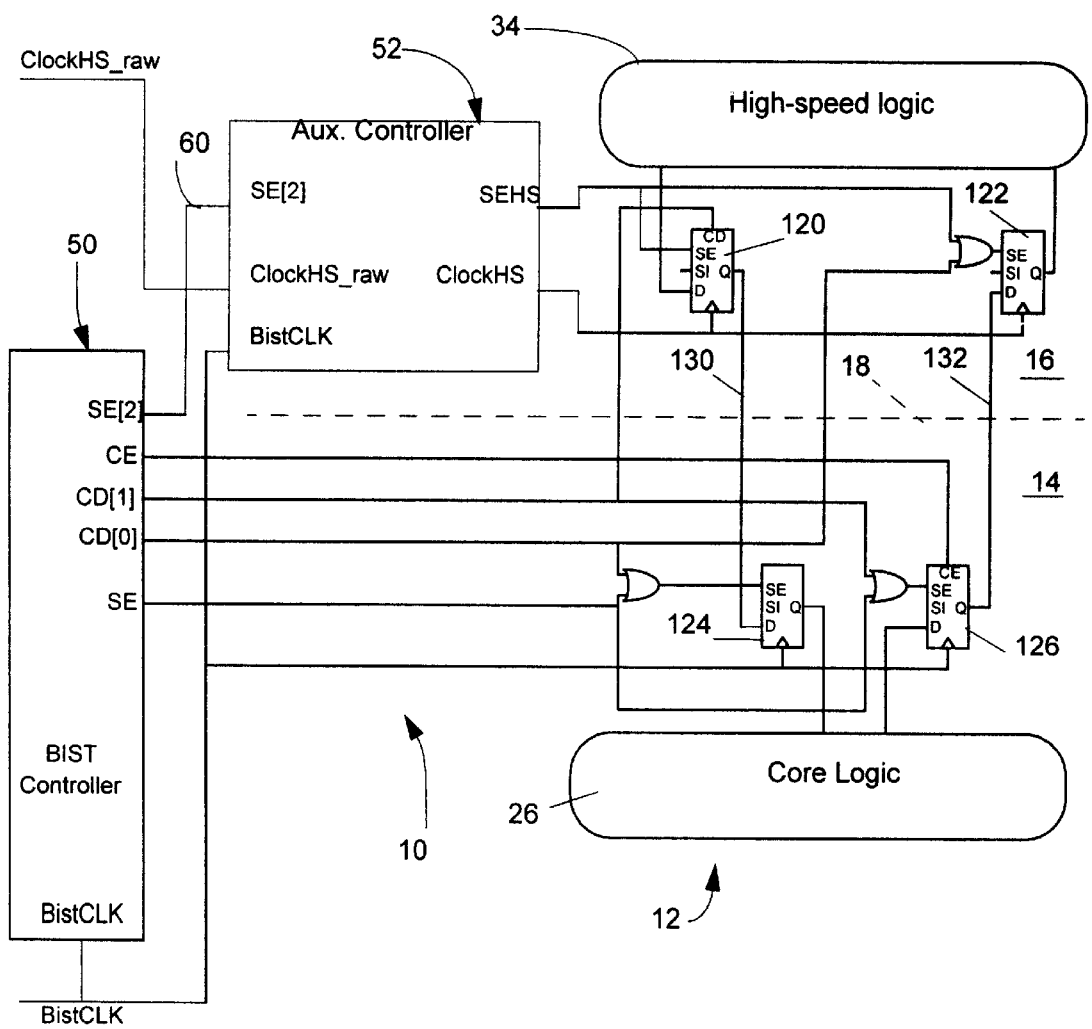
FIG. 5 is similar to FIG. 1 diagrammatically but illustrates a circuit having interacting low and high speed clock domains a primary test controller and an auxiliary test controller in accordance with second embodiment of the present invention.

The timing diagram of FIG. 4 shows the relationship of the key signals during the second scan-in sequence, the capture cycle and the initial portion of the scan-out sequence. For purposes of illustration, the domain test clock signal is shown to be approximately eight times faster than the main test clock signal.

While not shown in the figure, the low speed scan enable signal, SE, and the high speed configuration control signal, SE[2] are activated concurrently at the beginning of the scan-in sequence and in synchronism with the scan test vectors being clocked out of the PRPG at the main test clock rate.

The low speed domain scan enable signal, SE, is shown to be inactive for one period of the main test clock signal, the capture cycle, as it is normally the case for a scannable circuit. The signal becomes inactive consequent to the rising edge of the last shift cycle of the low speed domain. The last shift cycle, performed immediately before the capture operation, launches the test vector into the combinational portion of the circuit. The response of the combinational portion of the circuit is captured on the next active edge of the clock.

Configuration control signal SE[2] is inactive for two clock cycles of the main test clock signal in order to suppress two active edges of the shift clock. The control signal is deactivated consequent to the rising edge of the penultimate shift cycle. In this embodiment, the control signal is delayed using a single flip-flop (not shown) located in the delay circuit and responsive to the positive edge of the main test clock. The falling transition of the delayed control signal is detected by the transition detector which then generates two clock pulses of the capture clock derived from the domain test clock. These two pulses initiate the second shift sequence, consisting of one shift cycle and the capture cycle, to occur in the high speed clock domain 16. It can be seen from FIG. 4 that the time between the launch and capture operation in the high speed domain corresponds to the period of the domain test clock. Delay faults in the high speed clock domain can therefore be detected.

FIG. 4 shows that the capture clock signal is active throughout all of the scan-in and scan-out cycles and is inactive for two domain test clock cycles which effect the launch of the test vector and the capture in the high speed domain. FIG. 4 also shows how the high speed domain clock signal, ClockHS, is a composite of the main and domain test clocks. It will be particularly noted the delay which occurs after the penultimate shift cycle and the capture cycle. Finally it will be noted that the high speed scan enable signal SEHS is active during the last shift cycle (the first cycle effected at the domain clock rate) and inactive during the second of the two cycles.

The circuit shown in FIG. 2 will work well for any frequency ratio (i.e., the ratio of the domain test clock signal to the main test clock signal) greater than four. If a lower frequency ratio is required, the effective shift clock frequency must be reduced to maintain a frequency ratio greater than four with respect to the high speed clock frequency. This is easily achieved by adjusting the clock signal provided by the primary controller to the auxiliary controller. The primary test controller needs to be able to handle more than one effective clock frequency since the circuitry in the low speed clock domain still needs to be clocked at the main test clock rate. Two methods are available to handle this situation. Nadeau-Dostie et al U.S. Pat. No. 5,349,587 issued on Sep. 20, 1994 for "Multiple Clock Rate Test Apparatus for Testing Digital Systems" and Nadeau-Dostie et al U.S. patent application Ser. No. 08/752,499 filed on Nov. 20, 1996 for "Method and Apparatus for Scan Testing Digital Circuits", both incorporated herein by reference, can be used in the design of the primary controller. In both cases, the effective clock frequency can be ¼ of the reference clock applied to the main test controller. This means that clock frequency ratios of one or more can be handled.

An auxiliary test controller is required for each additional high speed or synchronous clock domain in the circuit. The only potential difference from one auxiliary test controller to another is the amount of delay applied to the configuration control signal SE[2] to take into account a different frequency ratio.

Interacting Clock Domains

FIGS. 5 and 6 illustrate a circuit in which clock domains interact along signal paths which traverse a clock domain boundary. This circuit is similar to that of FIG. 1 and therefore the same reference numerals have been used to designate the same parts. Four scannable memory elements 120, 122, 124 and 126, are interconnected to form two signal paths 130 and 132, crossing clock domain boundary 18. Signal path 130 extends from the high speed clock domain to the low speed clock domain. Signal path 132 extends from the low speed clock domain to the high speed clock domain. Each signal path includes a source memory element located in one domain and having an output connected to the input of a destination memory element located in another domain. The output of source memory elements may be connected to several destination memory elements. Similarly, destination memory elements may receive input from more than one source element. The method used is essentially the same as that described in Nadeau-Dostie et al U.S. patent application Ser. No. 09/209,790 filed on Dec. 11, 1998 for "Clock Skew Management Method and Apparatus", incorporated herein by reference.

The principle of the method is to suppress the capture of a scannable memory element that receives a signal from another clock domain if the scannable memory element that sources the signal is configured to capture and vice versa. Capture disable signals CD[0] and CD[1] control the suppression of the capture. These signals are exclusive, i.e. only one capture disable signal is inactive for any given scan vector shifted into the scan chains. In this simple example, both destination scannable memory elements are controlled by CD[0] and both source scannable memory elements are controlled by CD[1]. Source scannable memory element 126 for signal path 132 from the low speed clock domain to the high speed clock domain is clocked at an effective clock rate of one half of the low speed clock rate to provide additional setup time for the signal to propagate to the destination scannable memory element 122. This is achieved by applying an appropriate clock enable signal, CE, to the CE input of source element 126. When the capture of the source scannable memory element is suppressed, a large hold time is provided to ensure that the signal is correctly captured by the destination scannable memory element.

Another method of providing sufficient setup time for the signal to propagate to the destination scannable memory element is to increase the amount of delay imposed to the scan mode control signal in the auxiliary test controller by one half cycle of the main test clock. The resulting hold time provided is sufficient in many cases. A person skilled in the art will be able to select the appropriate method based on the knowledge of the clock frequencies, the propagation delays of the clock distribution trees and the signal path propagation time.

In the signal path 130 from the high speed clock domain to the low speed clock domain, the setup and hold times are shown in FIG. 6 to be approximately one clock period of the main test clock, which is sufficient in most cases. If not adequate, the delay imposed to the control signal SE[2] can be increased or decreased appropriately or the effective shift frequency of the source scannable memory element can be decreased as in the previous case.

Multi-Cycles Paths

Figure 7:
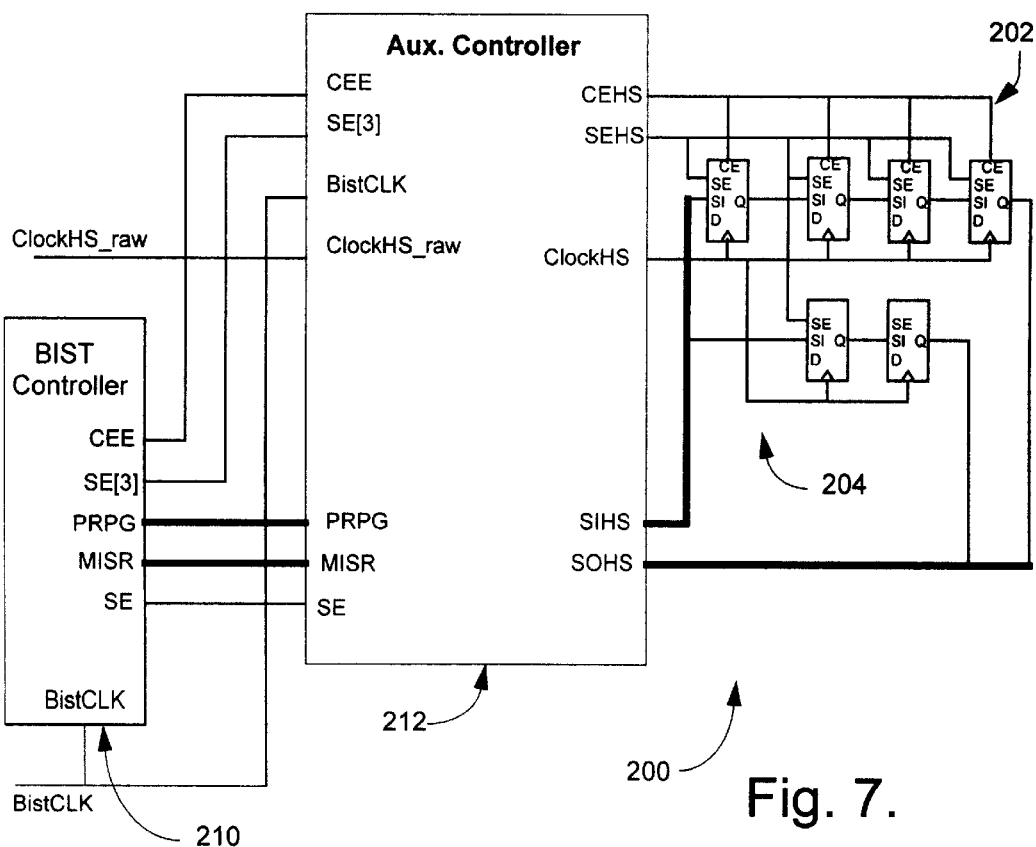
FIG. 7 is similar to FIGS. 1 and 5 but diagrammatically but illustrates a circuit having low and high speed clock domains with one scan chain comprised of circuit elements which source single cycle paths and a scan chain comprised of circuit elements which are the source of multi-cycle paths, a primary test controller and an auxiliary test controller in accordance with third embodiment of the present invention.

FIG. 7 illustrates a portion of a circuit 200 having multi-cycle signal paths. The circuit includes two scan chains 202 and 204, clocked by a high speed test clock signal, ClockHS, a primary BIST controller 210, and an auxiliary controller 212, associated with the two scan chains. The circuit has only one clock domain. Combinational logic and other synchronous and asynchronous clock domains, such as is illustrated in FIGS. 1–6, have not been shown in FIG. 7 so as to focus on multi-cycle path features.

Primary controller 210 operates under the control of a main test clock signal, BistClk, outputs test vectors at output PRPG to a corresponding input in the auxiliary test controller, and receives the responses to applied test vectors at an MISR input from an output of the auxiliary test controller, outputs a clock enable signal CEE, a configuration control signal SE[3] and a scan enable signal, SE, which would be applied to memory elements in synchronous clock domains if they had been shown in the figure. Auxiliary test controller 212 provides the domain test clock signal, ClockHS, a local clock enable signal, CEHS, a local Scan Enable signal, SEHS, processes and outputs test vectors and responses thereto at and from output SIHS and input SOHS, respectively, and controls test operations in response to control signals issued by the primary test controller.

Both scan chains include scannable memory elements. The memory elements in scan chain 204 are single cycle path elements which are the same or similar to those described earlier with reference to FIG. 13. Scan chain 202 is comprised of memory elements which are the source multi-cycle paths. Multi-cycle signal paths are signal paths which require one than one clock cycle to propagate from the output of a source element to the input of a destination element. Source memory elements are customarily provided with a clock enable input, CE, for receiving a clock enable signal thereat. FIG. 14 illustrates one of several possible configurations of such a memory element. It will be seen that the memory element is similar to that of FIG. 13, except that it is provided with an additional multiplexer to process the clock enable signal. An active clock enable signal enables the element to operate normally in response to clock pulses applied to its clock input. An inactive clock enable signal disables operation of the element and causes the element to hold its output constant. This is useful for elements which source multi-cycle paths because the elements can be configured in a hold mode for the number of clock pulses required for the signal to propagate through the multi-cycle path to the input of its destination. In an element which sources a multi-cycle path of two, the clock enable signal is deactivated every other cycle of the applied clock signal. Two cycles of the applied clock signal constitute one full cycle of operation of the memory element. In an element which sources a multi-cycle path of four, the clock enable signal is deactivated for three of every four cycles of the applied clock signal. Four cycles of the applied clock signal constitute one full cycle of operation of the memory element.

In the embodiment illustrated in FIG. 7, each of the elements in the first scan chain 202 is the source of a multi-cycle path of two, i.e. two clock cycles are required for the signal at their respective outputs to propagate to the input of their respective destination elements. Each such element is provided with a clock enable input, CE, which receives a clock enable signal, CEHS, output by the auxiliary test controller. When CEHS is active, the elements operate in response to the clock pulses applied to their clock inputs, CK. When CEHS is inactive, the elements are disabled and hold their outputs constant. In the specific example illustrated and described herein, CEHS is a clock signal having one-half of the clock rate of the applied clock signal, ClockHS. The clock enable signal CEHS output from the auxiliary controller is generated in response to the Clock Enable signal, CEE (Clock Enable Early), output by the primary test controller. CEE leads the CEHS signal by one half of one clock cycle. The clock enable signal introduces a complexity which must be addressed by the auxiliary controller.

The memory elements in the second scan path 204 are the source of single cycle paths. That is, only one clock cycle is required for the signal at their respective outputs to propagate to the input of their respective destination elements.

The method of controlling the memory elements is substantially the same as that of the earlier embodiments except that the configuration control signal is deactivated earlier than single cycle path memory elements by one less than the number of multi-cycle paths. The first shift clock signal is suppressed concurrently with deactivation of the configuration control signal and remains suppressed until an active to inactive transition of the delayed configuration control signal has been detected. At that point, the domain test clock signal is activated for a number of active edges of the clock signal corresponding to the number of multi-cycle paths. While the clock is suppressed, the scan test vector bits being loaded are stored for loading when the clock signal is re-enabled. The number of bits stored is one less than the number of multi-cycle paths. In the example, the number of multi-cycle paths is two and, therefore, one bit, the penultimate bit, is stored.

The clock enable signal is generated by the primary controller and is based on the main test clock. The configuration control signal also originates from the primary controller. The high speed clock signal originates from an independent source and is used by the auxiliary controller to generate a second shift clock signal during the second shift sequence and the signal during the capture cycle.

Figure 8:
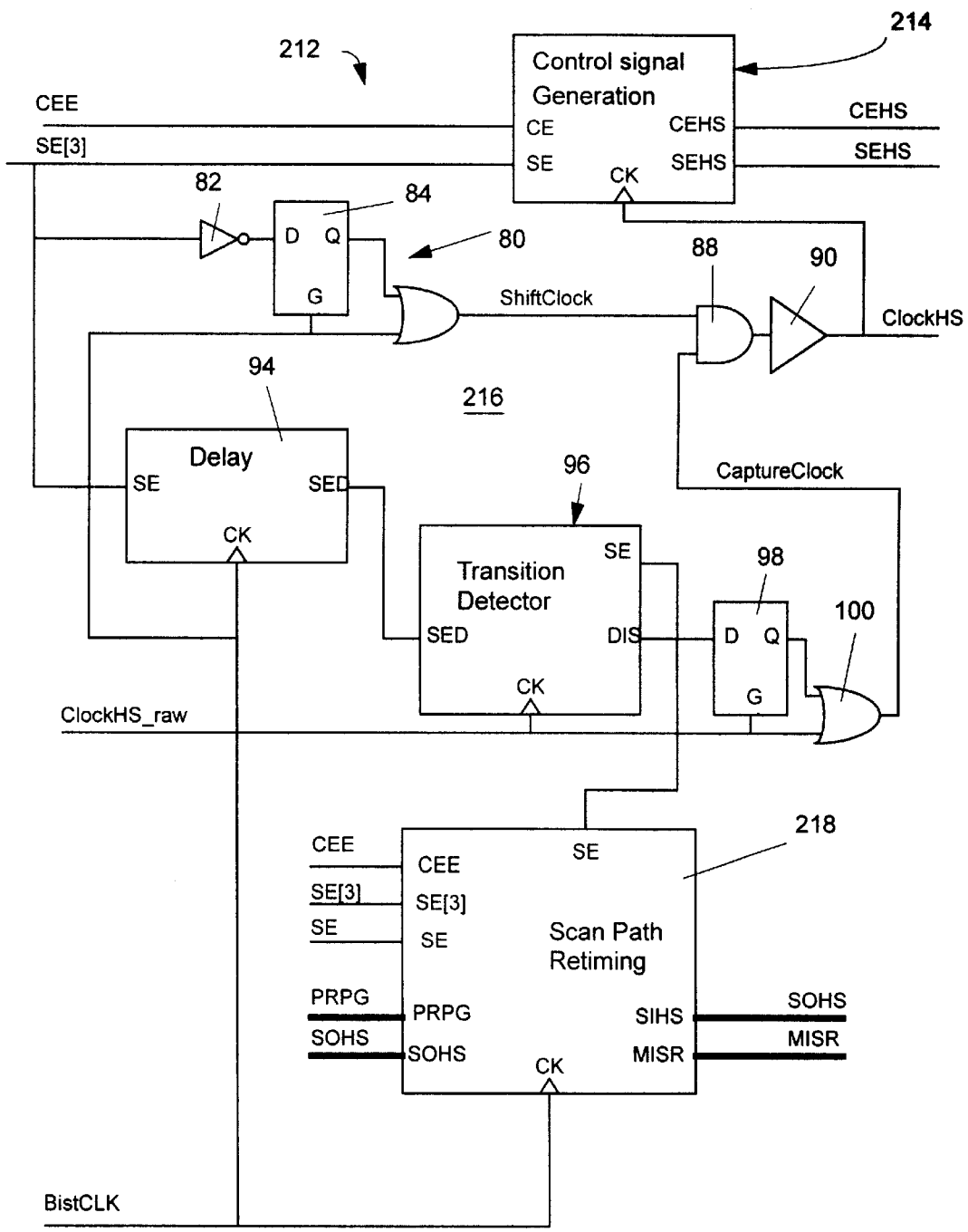
FIG. 8 diagrammatically illustrates a more detailed view of the auxiliary test controller of FIG. 7.

FIG. 8 is a block diagrammatic view of auxiliary test controller 212. The auxiliary controller is provided with a control signal generation circuit 214, a clock signal generation circuit 216, and a scan path retiming circuit 218.

Control signal generation circuit 214 is an asynchronous interface which modifies the clock enable and scan enable signals provided by the primary controller to provide the required synchronism between the main test clock and the high speed domain test clock. An embodiment of this circuit is illustrated in FIG. 9.

The clock signal generating circuit, illustrated in FIG. 8, generates the domain test clock signal input for the memory elements of both the multi-cycle path and single-cycle path chains. The shift clock signal is the main test clock signal, or a signal derived therefrom, for all but a predetermined number of bits of the test vector. The shift clock signal is switched from the main test clock signal to the domain test clock signal for loading stored test vector bits and performing the capture operation and is then switched back to the main test clock for shifting out the captured data.

Figure 12:
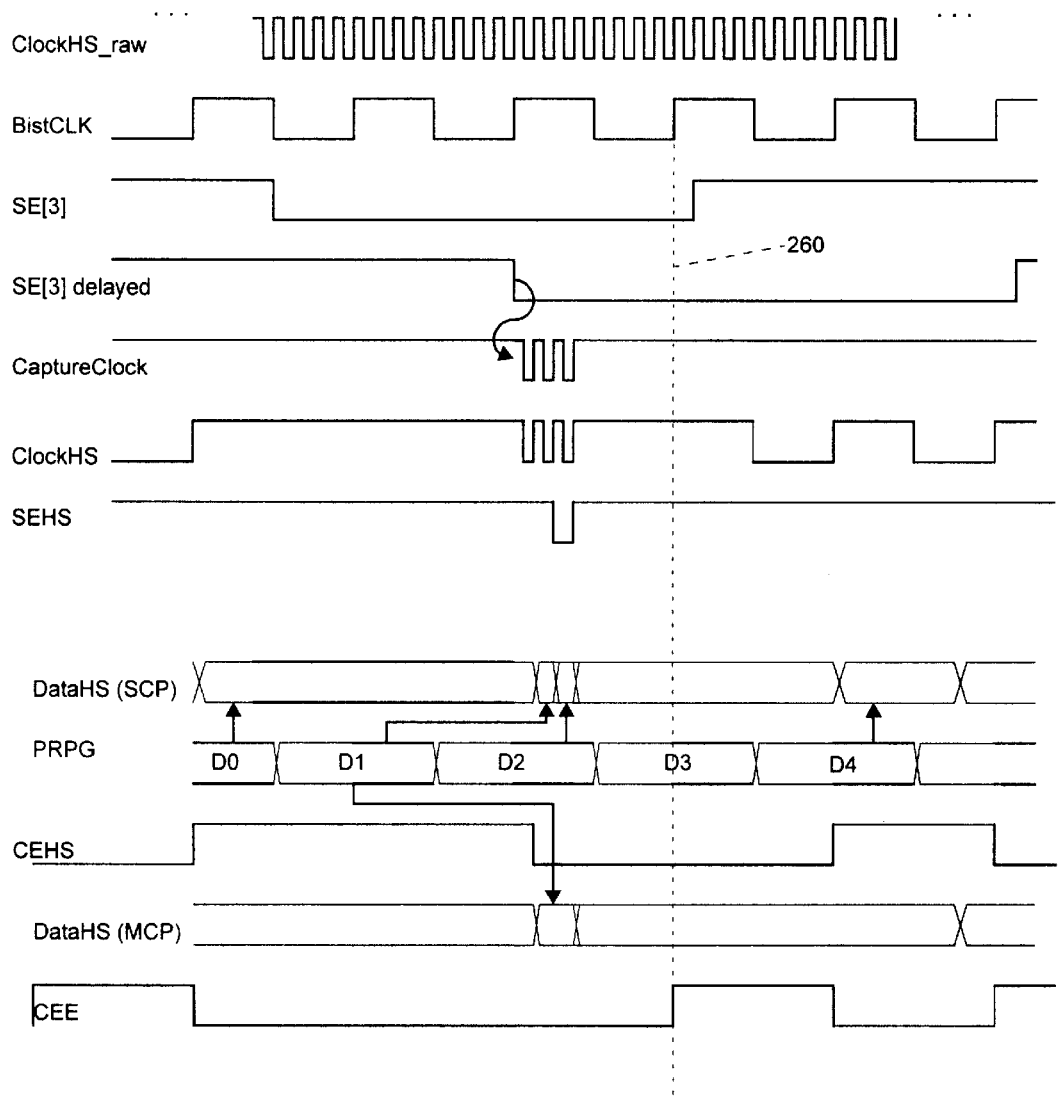
FIG. 12 is a timing diagram illustrating the state of a number of key signals during the course of a test in a circuit having multi-cycle paths.

Scan data retiming circuit 218, illustrated in FIG. 12, retimes the test vector data shifted into the scan chains and response data shifted out of the single cycle path chain to the primary controller.

Clock generation circuit 216, illustrated in FIG. 8 is substantially the same as that illustrated in FIG. 2 and therefore the same reference numerals have been used to designate the same components. However, the transition detector is modified (see FIG. 10 described later) to generate signals used for processing test vector data and response data. The desired results are obtained by the altering the timing at which the configuration control signal SE[3] is deactivated and reactivated and by the delay provided by the delay circuit.

Referring to FIG. 9, the control signal generation circuit 214 is comprised of a pair of retiming elements 220 and 222, in the form of D-Type flip-flops clocked by the domain test clock signal, and associated logic 224. Timing element 220 receives the clock enable signal, CEE, output by the primary controller and outputs the high speed clock enable signal, CEHS. Timing element 222 receives the configuration control signal SE[3] and outputs the high speed clock enable signal, SEHS. Logic 224 comprises a pair of OR gates 226 and 228 and an inverter 230. OR gate 226 receives the outputs of timing element 220 and inverter 230 and applies its output to one input of OR gate 228. The other input of OR gate 228 is configuration control signal SE[3]. The output of OR gate 228 is applied to the input of timing element 222.

High speed scan enable signal, SEHS, must remain active for all clock cycles except for the high speed clock cycle during which a capture is to be performed. This is clearly illustrated in the timing diagram of FIG. 9 which also shows that the high speed scan enable signal is substantially midway of the inactive period of the scan control signal. The SEHS signal becomes inactive only on the active edge of the clock cycle after SEHS becomes active and SE[3] and CEHS become inactive. The timing diagram in FIG. 9 illustrates how the durations of the active and inactive periods of the high speed clock enable signal are extended to accommodate changes in high speed domain clock signal.

The transition Detector used in this circuit is substantially the same as that of FIG. 2 in that it receives the delayed scan control signal SED and outputs signal DIS. However, the detector also generates an additional signal, SEL, which is used to select between a stored test vector bit and an incoming test vector bit. When SEL is inactive, a stored scan vector bit is injected into a scan vector stream and, when active, an incoming scan vector bit is injected into the stream. As shown in FIG. 10, the transition detector includes two memory elements 102 and 104 connected in series. The output of the second element is applied to an inverter 112 and to a third memory element 232. The outputs of the inverter and the third element are applied to the inputs of NAND gate 114. When both inputs of the NAND gate are active, a transition has been detected and the output of the NAND gate becomes inactive.

A second part of the transition detector generates signal DIS which deactivates the capture clock signal, and defines the duration of the signal. This part of the circuit comprises two memory elements 108 and 110 which receive the synchronized delayed configuration control signal. All elements are clocked by the domain test clock. The outputs of memory element 110 and inverter 114 are applied to a second NAND gate 116, the output of which is signal DIS.

Since the shift clock must be suppressed prior to the launch of the test vector, a mechanism must be provided to store test vectors in the process of being loaded. FIG. 11 illustrates a circuit 240 for storing test vectors. The circuit comprises two memory elements, 242 and 244, and two multiplexers 246 and 248. Incoming scan vector data from the PRPG bus is applied to high input of multiplexer 246 and to the low input of multiplexer 248. The other input to multiplexer 246 is the output of a memory element 244. The selector input of multiplexer 246 is a selector signal SEL described earlier. The output of multiplexer 246 is SIHS, the high speed scan-in data stream which is applied to the input of the high speed scan chain.

Second multiplexer 248 receives the scan data output by the PRPG of the primary controller, as already mentioned, and the feedback output of the memory element 244 and its output is connected to the input of the memory element 244. The selector input of the multiplexer 248 is a Store signal, STR, which is the inverted output of timing element 242. The input to the timing element is the clock enable signal, CEE, output by the primary controller. Memory element 244 and timing element 242 are clocked by the main test clock signal, BisfClk.

Store signal, STR, is active only when the clock enable signal is inactive which is every second cycle of the main test clock. When the store signal is active, the output of the memory element is fed back to its input, holding its value constant. When the Store signal is inactive, a test data bit is applied to the input of the memory element. In this way, the circuit retains the test data value for two cycles of the test clock, including those cycles during which the memory elements are inactive (clock enable inactive). The store value is injected when the SEL signal is inactive. When the number of cycles of the multi-cycle paths two, the CEE signal is made inactive during the penultimate and last shift cycles of the shift sequence. In the general case, the CEE signal is made inactive for a number of shift cycles which is one less than the number of multi-cycle paths and for the capture cycle.

The specific circuit shown in FIG. 11 provided one memory element to store a scan vector bit. In general, one such memory element would be provided for each scan vector bit to be stored.

FIG. 12 illustrates the key signals for a multi-cycle path environment in which the number of multi-cycle paths is two. Referring to the waveforms in the upper portion of FIG. 12, it will be noted that the configuration control signal, SE[3] is deactivated following the fourth active edge of the shift clock prior to the capture edge, indicated by vertical dotted line 260 and reactivated following the capture edge. The first shift clock signal is suppressed concurrently with the configuration control signal becoming inactive. It is reactivated for three cycles of the domain test clock when the delayed, synchronized configuration control signal, SE[3], becomes inactive (the active to inactive transition has been detected) and then is suppressed again following the capture edge. The clock signal remains suppressed until the configuration control signal becomes active which, as mentioned, is after the capture edge has occurred. When domain clock signal is reactivated, its clock rate is that of the domain shift clock signal which corresponds to the main test clock signal or derivative thereof.

It will be seen that ClockHS has been suppressed before the penultimate edge of the shift clock. It is the data associated with this edge which must be stored in the manner explained earlier. Thus, the first active edge of the three high speed edges loads the stored bit, the second edge launches the data and the third edge captures the response of the combinational logic to the launched test data.

The captured data in the high speed multi-cycle path chain is applied to the input of the MISR. The single cycle path chain output is applied to one input of a multiplexer 250 whose other output is kept low by connecting to ground, GND. The selector control is the configuration control signal SE[3]. The output of the multiplexer is applied to the input of a retiming element 252 which is clocked by the main test clock. The output of the retiming element is applied to the MISR.

A typical circuit may comprise all or a subset of the various types of circuit described above, i.e. non-interacting low and high speed domain, interacting low and high speed domains and domains with multi-cycle paths, each having one or more scan paths.

We claim:

1. A method of testing a circuit having two or more clock domains at respective domain test clock rates and under control of a main test clock signal, said circuit having core logic, a plurality of scannable memory elements, each having a clock input, an input connected to an output of said core logic and/or an output connected to an input to said core logic, and configurable in scan mode in which said memory elements are connected to define one or more scan chains in each said domain and in normal mode in which said memory elements are connected to said core logic in normal operational mode, said method comprising:

configuring said memory elements in scan mode;

concurrently clocking a test stimulus into each scan chain of each said clock domain including, for each clock domain having a domain test clock signal which is synchronous with respect to said main test clock signal, clocking said test stimulus at a shift clock rate derived from said main test clock signal and, for each clock domain having a domain test clock signal which is asynchronous with respect to said main test clock signal, clocking all but a predetermined number of bits of said test stimulus at a first domain shift clock rate derived from said main test clock signal followed by clocking said predetermined number of bits of said test stimulus at a second domain shift clock rate corresponding to said domain test clock rate;

configuring said memory elements of each scan chain in normal mode in which the memory elements of each scan chain are interconnected by said core logic in the normal operational mode;

clocking each memory element in each scan chain at its respective domain test clock rate for at least one clock cycle thereof;

configuring said memory elements in scan mode; and clocking a test response pattern out of each of the scan chains at its respective domain shift clock rate during a respective scan-out interval, all respective scan-out intervals overlapping in time for a plurality of clock cycles at the highest of the respective clock rates.

2. A method, as defined in claim 1, for interacting synchronous and asynchronous domains, said configuring said memory elements of each scan chain in normal mode including configuring said memory elements of each scan chain of said interacting synchronous and asynchronous domains in normal mode during an overlapping normal mode interval in which the memory elements of each said scan chain of said interacting synchronous and asynchronous domains are interconnected by said core logic in the normal operational mode, all respective normal mode intervals overlapping in time such that a value captured by said memory elements is a combinational function of test data shifted into said memory elements.

3. A method as defined in claim 1, further including, for each signal path crossing a clock domain boundary between a pair of clock domains, suppressing capture in a memory element which is source or destination of a cross boundary signal if its associated destination or source memory element, respectively, in another domain is configured to perform a capture in said normal mode.

4. A method as defined in claim 3, for each clock domain having memory elements which are the source of multi-cycle signal paths, said predetermined number of bits being the number of cycles of said multi-cycle signal path, said step of concurrently clocking a test stimulus including storing all but the last one of said predetermined number of bits, and subsequently clocking stored bits at said second domain shift clock rate immediately prior to clocking in said last one of said bits.

5. A method as defined in claim 1, said step of clocking a test stimulus including, in each asynchronous domain, suppressing the clock signal applied to the clock input of said memory elements upon completing clocking of said all but a predetermined number of bits of said test stimulus; and re-activating said clock signal a predetermined number of clock cycles of said domain test clock signal prior to said normal mode cycle.

6. A method, as defined in claim 5, wherein the predetermined number of bits stored is one less than the number of cycles of said multi-cycle signal path.

7. A method as defined in claim 1, further including:

generating a domain configuration control signal for each said asynchronous clock domain;

activating said control signal at the beginning of each concurrently clocking operation; and deactivating said control signal a predetermined number of clock cycles prior to launch of a test vector at each said memory element.

8. A method, as defined in claim 7, further including, for each asynchronous clock domain:

providing a domain test clock signal operable as a domain clock signal;

applying an active domain scan enable signal to a scan enable input of said memory elements in said domain when said control signal is active so as to configure said memory elements in scan mode;

detecting a transition of said domain control signal from active to inactive;

replacing said first domain shift clock signal with said second domain shift clock signal consequent to detecting said transition; and applying an inactive domain scan enable signal to said scan enable input of said memory elements in said domain consequent to detecting said transition so as to configure said memory elements in normal mode.

9. A method as defined in claim 8, further including delaying detection of said transition for a predetermined delay period.

10. A method, as defined in claim 1, wherein the ratio of the clock rate of first and second domain shift clock rates is two or greater.

11. A method of testing a circuit having two or more clock domains at respective domain test clock rates and under control of a main test clock signal, said circuit having core logic, a plurality of scannable memory elements, each having a clock input, an input connected to an output of said core logic and/or an output connected to an input to said core logic, and configurable in scan mode in which said memory elements are connected to define one or more scan chains in each said domain and in normal mode in which said memory elements are connected to said core logic in normal operational mode, said method comprising:

configuring said memory elements in scan mode including:

for each synchronous domain in which respective domain test clock signal is synchronous with respect to said main test clock signal, generating and applying active memory element configuration signals to memory elements in said synchronous domains;

for each asynchronous clock domain in which the domain test clock signal thereof is asynchronous with respect to said main test clock signal, generating an active configuration control signal, generating active memory element scan mode configuration signals and applying said memory element configuration signals to said memory elements; and concurrently clocking a test stimulus into each scan chain of each said clock domain including:

for each synchronous clock domain, clocking said test stimulus at a domain shift clock rate derived from said main test clock signal and, for each asynchronous clock domain:

generating respective first and second domain shift clock signals, said first domain shift clock signal being derived from said main test clock signal and said second domain shift clock signal being derived from said respective domain test clock signal;

selecting said first domain shift clock signal as a domain clock signal;

clocking all but a predetermined number of bits of said test stimulus under control of said domain clock signal;

generating an inactive configuration control signal, suppressing said domain clock signal for a predetermined time interval in response to said inactive configuration control signal;

selecting said second domain shift clock signal as said domain clock signal;

activating said domain clock signal and clocking said predetermined number of bits of said test stimulus at under control of said domain clock signal;

configuring said memory elements of each scan chain in normal mode during an overlapping normal mode interval in which the memory elements of each scan chain are interconnected by said core logic in the normal operational mode, all respective normal mode intervals overlapping in time such that a value captured by said memory elements is a combinational function of test data shifted into said memory elements;

configuring said memory elements in scan mode including:

for each asynchronous clock domain, generating an active configuration control signal, generating active memory element scan mode configuration signals and applying said memory element configuration signals to said memory elements, and for each synchronous domain, generating and applying active memory element configuration signals to memory elements in said synchronous domains;

clocking each memory element in each scan chain at its respective domain test clock rate for at least one clock cycle thereof;

clocking a test response pattern out of each of the scan chains including:

for each asynchronous clock domain, clocking said test response pattern under the control of said domain first shift clock signal; and for each synchronous clock domain, clocking a test response pattern therefrom under control of its respective domain shift clock signal; and analyzing said test response pattern from each said clock domain.

12. A method as defined in claim 11, wherein, in single-cycle scan paths, said predetermined number of bits is one and, in multi-cycle scan paths comprised of memory elements which source multi-cycle signal paths, said predetermined number of bits is a function of the number of cycles required by the longest multi-cycle path to propagate through said core logic.

13. A method as defined in claim 11, said step of configuring said memory elements in scan mode including generating a configuration control signal for each clock domain and responding to an active configuration control signal by applying an active scan enable signal to each memory element in said each clock domain and by selectively applying said domain shift clock signal to the clock input of said memory elements;

said concurrently clocking a test stimulus including shifting bits of said stimulus while said configuration control signal is active;

generating an inactive configuration control signal on the penultimate cycle of said clocking sequence in clock domains which do not include elements which source multi-cycle signal paths and generating an inactive configuration control signal on the third cycle prior to a capture cycle in clock domains which include elements which source multi-cycle signal paths;

continuously sampling said configuration control signal at the clock rate of said respective domain test clock signal for detecting a transition of said control signal from active to inactive;

suppressing the clock signal applied to the memory elements when said transition is detected until the cycle on which said test vector is launched from said memory elements;

said step of concurrently clocking a test response pattern out of said scan chains including:

generating an active configuration control signal;

responding to an active configuration control signal by generating and applying an active scan enable signal to the scan enable input of said memory elements and applying said respective shift clock signal to the clock input of said memory elements.

14. A test controller for use in testing an integrated circuit having core logic circuitry and two or more clock domains operable at respective domain clock rates, each clock domain having a plurality of scannable memory elements, each having a clock input, an input connected to an output of said core logic and/or an output connected to an input to said core logic, and configurable in scan mode in which said memory elements are connected to define one or more scan chains in each said domain and in normal mode in which said memory elements are connected to said core logic in normal operational mode, said test controller comprising:

a primary test controller for controlling circuit test operations under control of a main test clock signal, said primary test controller being operable to:

concurrently load a test stimulus to each scan chain in each clock domain and receive response data from each said scan chain at respective domain shift clock rates;

generate respective domain shift clock signals derived from said main test clock signal for each clock domain;

generate a mode control signal for each synchronous clock domain; and generate respective domain configuration control signal for each asynchronous clock domain in which the domain test clock signal is asynchronous with respect to said main test clock signal; and an auxiliary test controller associated with each said asynchronous clock domain for controlling test operations therein under control of said primary test controller, each said auxiliary test controller being operable to generate a memory element clock signal derived from said respective domain shift clock signal when said respective domain configuration control signal is active and derived from said domain test clock signal when said domain configuration control signal is inactive;

each said auxiliary test controller being responsive to said respective configuration control signal by generating memory element configuration signals operable for configuring said memory elements in said scan mode or said normal mode.

15. A test controller as defined in claim 14, said primary test controller generating an active configuration control signal for each asynchronous clock domain at the beginning of a test stimulus loading sequence and a response data unloading sequence and generating an inactive configuration control signal a predetermined number of clock cycles of said respective domain shift clock signal prior to a capture cycle;

each said auxiliary test controller being responsive to an active configuration control signal by applying one or more local configuration signals to each memory element in its respective clock domain so as to configure said memory elements in scan mode and by applying said domain shift clock signal to the clock input of said memory elements;

each said auxiliary test controller being responsive to an inactive configuration control signal by suppressing the clock signal applied to said memory elements for a predetermined period of time, detecting the transition of said configuration control signal from active to inactive and, upon detecting said transition, applying a predetermined number of active edges of said respective domain test clock signal to the clock input of said memory elements and applying local configuration control signals to said memory elements prior to the last one of said predetermined number of active edges so as to configure said memory elements in normal mode to capture the response to said test vector and thereafter suppressing the clock signal applied to the clock input of said memory elements.

16. A test controller as defined in claim 15, said primary controller generating an inactive configuration control signal consequent to the penultimate edge of said domain shift clock signal of a loading sequence in single-cycle path clock domains.

17. A test controller as defined in claim 15, said primary controller generating an inactive configuration control signal consequent to a predetermined edge of said domain shift clock signal of a loading sequence in clock domains having memory elements which source multi-cycle signal paths, said predetermined edge being the number of cycles of said multi-cycle signal paths prior to the launch of a test vector bit.

18. A test controller, as defined in claim 17, wherein each auxiliary test controller which controls scan paths whose memory elements source multi-cycle signal paths further including storage means for storing test vector bits transmitted along the scan path while said clock signal is suppressed.

19. A test controller as defined in claim 14, each said auxiliary test controller including:

first means responsive to said configuration control signal and said domain test clock signal for generating memory element configuration signals for configuring said memory elements in a scan mode or normal mode;

second means responsive to said configuration control signal, said respective domain shift clock signal and said domain test clock signal for selectively applying one of said domain shift clock signal and said domain test clock signal to the clock input of its associated memory elements; and third means for detecting the transition of said configuration control signal from active to inactive and responsive to a detected transition by selecting said domain test clock signal.

20. A test controller, as defined in claim 19, further including fourth means for delaying application of said configuration control signal to said third means for a predetermined period of time.

21. A test controller as defined in claim 19, said third means being operable to apply only a predetermined number of active clock edges of said domain test clock signal to said memory elements.

22. A test controller as defined in claim 19, said first means including retiming means clocked by said domain test clock signal for retiming said configuration control signal and outputting a local scan enable signal.

23. A test controller, as defined in claim 19, said first means including retiming means clocked by said domain test clock signal for retiming a clock enable signal from said primary controller and outputting a local clock enable signal.

24. A test controller as defined in claim 14, said auxiliary test controller including a clock signal generating circuit for generating and applying a local clock signal to the clock input of said memory elements, said clock signal generating signal including:

a shift clock generating circuit including:
an inverter receiving said configuration control signal and outputting an inverted configuration control signal;
a retiming element clocked by said domain shift clocked signal for retiming said inverted configuration control signal; and
an OR gate for receiving said inverted configuration control signal and said respective domain shift clock signal and producing a shift clock signal;

a capture clock signal generating circuit including:
a transition detector for detecting an active to inactive transition of said delayed configuration control signal and producing a capture clock disable signal;
a retiming element clocked by a source domain clock signal for producing a determined capture clock disable signal; and
an OR gate for receiving said retimed capture clock disable signal and said source domain clock signal for producing a capture clock signal;

an AND gate for receiving said shift clock signal and said capture clock signal and outputting said local clock signal.

25. A test controller, as defined in claim 24, said capture clock signal generating circuit further including a delay circuit clocked by said respective domain shift clock signal for receiving said configuration control signal and producing a delayed configuration control signal.

26. A test controller as defined in claim 24, said transition detector including timing means for defining the duration of said capture clock signal.

27. A test controller, as defined in claim 14, said auxiliary test controller being operable to control a clock domain having memory elements which source multi-cycle signal paths, including:

a memory element control signal generating circuit for generating and applying memory element configuration control signals to said memory elements;

a memory element clock signal generating circuit responsive to said configuration control signal, said domain shift control signal and a source domain clock signal for generating and applying a domain clock signal to the clock input of said memory elements; and a scan path retiming circuit for retiming test stimulus output by said primary test controller and data captured in response to said test stimulus.

28. A test controller, as defined in claim 27, said primary test controller producing a clock enable signal under control of said domain shift clock signal, said memory element control signal generating circuit including:

a first retiming circuit clocked by domain clock signal for retiming said clock enable signal and outputting a retimed clock enable signal;

a second retiming circuit clocked by domain test clock signal for retiming said configuration control signal for outputting a scan mode control signal to said memory elements.

29. A test controller as defined in claim 27, said primary test controller producing a clock enable signal under control of said domain shift clock signal, said scan path retiming circuit including a test stimulus retiming circuit including:

storage means clocked by said domain shift clock signal for storing data bits from said test stimulus;

first selector means having an output connected to an input of said storage means and having a first input for receiving said test stimulus and a second input for receiving the output of said storage means and a data source select control signal for selectively applying one of said first and second inputs to the input of said storage means;

second selector means having an output connect to a scan chain in said domain and a first input for receiving said test stimulus data, a second input the output of said storage means and a third input for receiving a data source select control signal for selectively applying one of said second selector means inputs to said second selector means output; and means responsive to said clock enable signal for generating said data source select control signal.

30. A test controller, as defined in claim 27, said scan path retiming circuit including a captured data retiming circuit for a scan path having memory elements which source single-cycle paths in a clock domain having a parallel multi-cycle signal path scan path, said retiming circuit including:

a selector means having a first input for receiving a scan output of a single cycle signal path scan path, a second input for receiving a signal of fixed value and a selector input for receiving said configuration control signal and operable to connect one of said inputs to the output of said selector means; and a retiming element for retiming the output of said selector means under control of said domain shift clock signal.

31. A test controller for use in testing an integrated circuit having core logic circuitry and two or more clock domains operable at respective domain clock rates, each clock domain having a plurality of scannable memory elements, each having a clock input, an input connected to an output of said core logic and/or an output connected to an input to said core logic, and configurable in scan mode in which said memory elements are connected to define one or more scan chains in each said domain and in normal mode in which said memory elements are connected to said core logic in normal operational mode, said test controller comprising:

a primary test controller for controlling circuit test operations under control of a main test clock signal, said primary test controller including:

a pseudo random pattern generator operable under control of said main test clock signal for concurrently generating a test stimulus for each scan chain in each clock domain;

a multiple input signature analyser operable under control of said main test clock signal for receiving and analysing response data from each said scan chain;

a circuit for generating a domain shift clock signal derived from said main test clock signal for each clock domain; and a circuit for generating a configuration control signal for each said clock domain; and an auxiliary test controller associated with each asynchronous clock domain for controlling test operations therein, each said auxiliary test controller receiving a respective domain shift clock signal from said primary controller and a respective domain test clock signal; each said auxiliary test controller including:

means responsive to said configuration control signal for generating memory element configuration signals for configuring said memory elements in a scan mode or normal mode;

a clock signal generating circuit for generating and applying a local clock signal to the clock input of said memory elements, said clock signal generating circuit including:

a shift clock generating circuit responsive to said configuration control signal and said respective domain shift clock signal and producing a shift clock signal corresponding to said respective domain shift clock signal; and a capture clock signal generating circuit responsive to said configuration control signal and said predetermined domain clock signal for producing a capture clock signal corresponding to said respective domain test clock signal; and means receiving said shift clock signal and said capture clock and selectively outputting one of said shift and capture clock signals as said local clock signal.

32. A test controller as defined in claim 31, said shift clock generating circuit including:

an inverter receiving said configuration control signal and outputting an inverted configuration control signal;

a retiming element clocked by said domain shift clock signal for retiming said inverted configuration control signal; and an OR gate for receiving said inverted configuration control signal and said domain shift clock signal and producing said shift clock.

33. A test controller, as defined in claim 32, said capture clock signal generating circuit including:

a delay circuit clocked by said domain shift clock signal for receiving said configuration control signal and producing a delayed configuration control signal;

a transition detector for detecting an active to inactive transition of said delayed configuration control signal and producing a capture clock disable signal;

a retiming element clocked by a source domain clock signal for producing a retimed capture clock disable signal; and an OR gate for receiving said retimed capture clock disable signal and said source domain clock signal for producing a capture clock signal.

34. In a test controller for testing an integrated circuit having core logic circuitry and two or more clock domains operable at respective domain clock rates, each clock domain having a plurality of scannable memory elements, each having a clock input, an input connected to an output of said core logic and/or an output connected to an input to said core logic, and configurable in scan mode in which said memory elements are connected to define one or more scan chains in each said domain and in normal mode in which said memory elements are connected to said core logic in normal operational mode, the improvement comprising:

a primary controller for controlling circuit test operations under control of a main test clock signal and for controlling testing of synchronous clock domains whose domain test clock signal is synchronous with respect to said main test clock signal, said primary controller generating a respective shift clock signal derived from said main test clock signal for each clock domain, and a configuration control signal for each asynchronous clock domain in said circuit; and an auxiliary controller associated with each asynchronous clock domain whose domain test clock signal is not synchronous with respect to said main test clock signal, and each said auxiliary controller being responsive to said primary controller for controlling testing of its associated clock domain, each auxiliary controller generating a memory element clock signal and responsive to an active configuration clock signal for applying its respective domain shift clock signal to said memory elements and responsive to an inactive configuration control signal for applying said domain test clock signal to said memory elements.

* * * * *

UNITED STATES PATENT AND TRADEMARK OFFICE
CERTIFICATE OF CORRECTION

PATENT NO. : 6,442,722 B1
DATED : August 27, 2002
INVENTOR(S) : Nadeau-Dostie et al.

It is certified that error appears in the above-identified patent and that said Letters Patent is hereby corrected as shown below:

Column 22,
Line 48, please replace "determined" with -- retimed --.

Signed and Sealed this

Seventh Day of January, 2003

JAMES E. ROGAN
*Director of the United States Patent and Trademark Office*